(12) United States Patent
Choi (10) Patent No.: US 9,007,115 B2
(45) Date of Patent: Apr. 14, 2015

(54) INTEGRATED CIRCUIT

(71) Applicant: SK hynix Inc., Icheon-si Gyeonggi-do (KR)

(72) Inventor: Hoon Choi, Icheon-si Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/489,618

(22) Filed: Sep. 18, 2014

(65) Prior Publication Data

US 2015/0002203 A1   Jan. 1, 2015

Related U.S. Application Data

(62) Division of application No. 13/411,536, filed on Mar. 3, 2012, now Pat. No. 8,872,551.

(30) Foreign Application Priority Data

Oct. 28, 2011 (KR) .......................... 10-2011-0111329

(51) Int. Cl.
*H03K 3/00* (2006.01)
*H03K 5/13* (2014.01)
*H03K 21/40* (2006.01)
*H03K 5/22* (2006.01)

(52) U.S. Cl.
CPC ................ *H03K 5/13* (2013.01); *H03K 21/406* (2013.01); *H03K 5/22* (2013.01)

(58) Field of Classification Search
CPC ....... H03L 7/0814; H03L 7/07; H03L 7/0812; H03L 7/087; H03L 7/089; H03L 7/10; H03L 7/00; H03L 7/0805; G06F 1/10; G06F 14/78; G06F 17/40; G06F 7/4873; H03K 5/133
USPC ........... 327/99, 158, 149, 291, 237, 245, 270, 327/141, 151, 156, 160, 163, 292, 299
See application file for complete search history.

(56) References Cited

U.S. PATENT DOCUMENTS 7,474,720 B2 * 1/2009 Yuuki et al. .................... 375/354
2008/0111595 A1 * 5/2008 Na ................................. 327/149

* cited by examiner

*Primary Examiner* — Diana J Cheng
(74) *Attorney, Agent, or Firm* — William Park & Associates Patent Ltd.

(57) ABSTRACT

An integrated circuit includes a clock control unit configured to selectively output an external clock or a delayed clock acquired by delaying the external clock as an input clock in response to a divided clock generated by dividing the external clock, when a test mode is entered; and an internal circuit operating in response to the input clock.

4 Claims, 7 Drawing Sheets

INTEGRATED CIRCUIT

CROSS-REFERENCES TO RELATED APPLICATIONS

The present application claims priority under 35 U.S.C 119(a) to Korean Application No. 10-2011-0111329, filed on Oct. 28, 2011, in the Korean Intellectual Property Office, which is incorporated herein by reference in its entirety as set forth in full.

BACKGROUND

A system has a plurality of integrated circuits mounted thereto as parts. In order for the system to normally operate, the integrated circuits included in the system should operate free of a fail. If a fall occurs even in one of the integrated circuits included in the system during operation, the system is sorted as a bad product.

A fall of a system may occur when noise is included in the system voltage supplied from a system controller to an integrated circuit, or jitter is included in a system clock. Therefore, an integrated circuit that exhibits system voltage noise or system clock jitter becomes unstable and a fail occurs in the integrated circuit, which may lead to a system fail. Jitter means a component that causes a change in the cycle and the duty ratio of the system clock.

Because system voltage noise or system clock jitter may be detected only after the integrated circuit is mounted to the system, a marked retardation in a system development project may result. Also, when the system fail has occurred, it is difficult to find where a failure has occurred in the mounted integrated circuit.

SUMMARY

An embodiment of the present invention relates to an integrated circuit which allows a system fail to be tested before an integrated circuit is mounted to a system.

In one embodiment, an integrated circuit includes: a clock control unit configured to selectively output an external clock or a delayed clock acquired by delaying the external clock as an input clock in response to a divided clock generated by dividing the external clock, when a test mode is entered; and an internal circuit operating in response to the input clock.

In another embodiment, an integrated circuit includes: a clock control unit configured to transfer a first reference voltage or a second reference voltage as a first selection reference voltage in response to a divided clock which is generated by dividing an external clock when a test mode is entered, and generate an input clock by comparing the first selection reference voltage and the external clock; and an internal circuit configured to operate in response to the input clock.

In another embodiment, an integrated circuit includes: a test mode signal generation unit configured to generate first and second test mode signals in response to a test mode enable signal; a clock control unit configured to generate a divided clock by dividing an external clock and a delayed clock by delaying the external clock, in response to one of the first or second test mode signals, and selectively output the external clock or the delayed clock as an input clock in response to the divided clock; and an internal circuit configured to operate in response to the input clock.

In another embodiment, an integrated circuit includes: a test mode signal generation unit configured to generate first and second test mode signals in response to a test mode enable signal; a clock control unit configured to generate a divided clock by dividing an external clock in response to one of the first or second test mode signals, and generate an input clock by transferring a first reference voltage or a second reference voltage as a first selection reference voltage in response to the divided clock; and an internal circuit configured to operate in response to the input clock.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
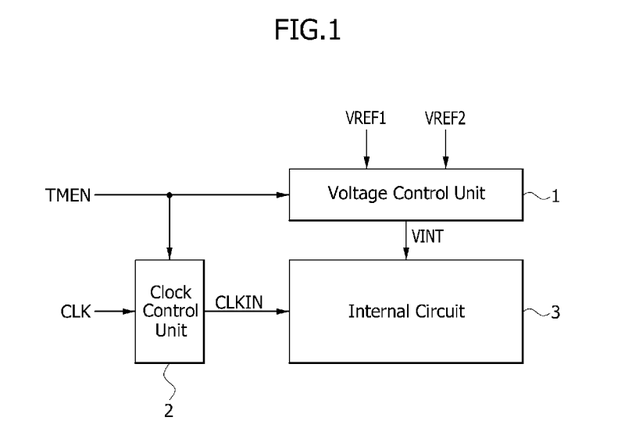
FIG. 1 is a block diagram showing a configuration of an integrated circuit in accordance with an embodiment of the present invention.

FIG. 1 is a block diagram showing a configuration of an integrated circuit in accordance with an embodiment of the present invention.

Referring to FIG. 1, the integrated circuit in accordance with the present embodiment includes a voltage control unit 1, a clock control unit 2, and an internal circuit 3. The voltage control unit 1 is configured to receive a first reference voltage VREF1 and a second reference voltage VREF2 in response to a test mode enable signal TMEN and control the level of an internal voltage VINT. The clock control unit 2 is configured to control a cycle and a duty ratio of an external clock CLK and generate an input clock CLKIN. The internal circuit 3 is a circuit such as a DLL (delay locked loop) of a semiconductor memory device and the like, and is configured to receive the internal voltage VINT and operate in response to the input clock CLKIN. The test mode enable signal TMEN is a signal which is enabled to a logic high level to enter a test mode for testing a system fail situation likely to occur after the integrated circuit is mounted to a system. The internal voltage VINT may be any one of a high voltage (VPP), a core voltage (VCORE) and a ground voltage (VSS) which are used in a semiconductor memory device.

Figure 2:
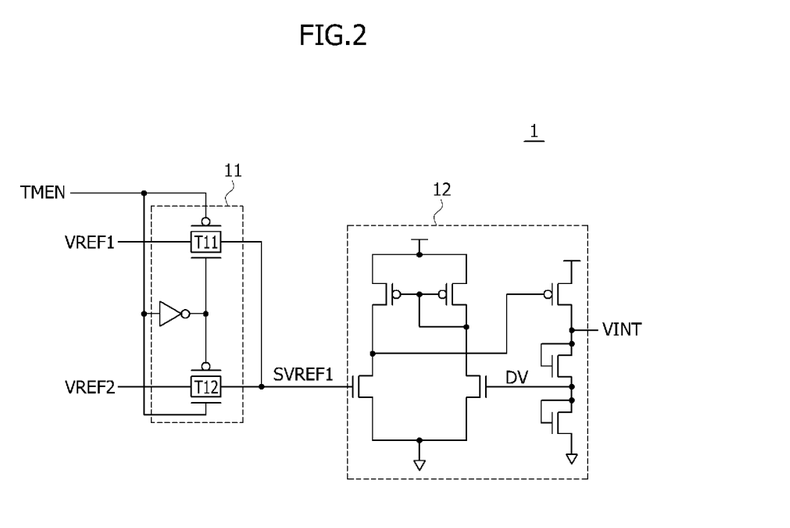
FIG. 2 is a circuit diagram showing an example embodiment of a voltage control unit included in the integrated circuit shown in FIG. 1.

Referring to FIG. 2, the voltage control unit 1 includes a first reference voltage transferring section 11 and an internal voltage driving section 12. The first reference voltage transferring section 11 includes a transfer gate T11 which transfers the first reference voltage VREF1 as a first selection reference voltage SVREF1 in response to the test mode enable signal TMEN, and a transfer gate T12 which transfers the second reference voltage VREF2 as the first selection reference voltage SVREF1 in response to the test mode enable signal TMEN. The internal voltage driving section 12 is configured to compare a divided voltage DV generated by dividing the internal voltage VINT with the first selection reference voltage SVREF1 and drive the internal voltage VINT.

The voltage control unit 1 configured in this way transfers the second reference voltage VREF2 as the first selection reference voltage SVREF1 when a test mode is entered and the test mode enable signal TMEN is enabled to the logic high level, and drives the internal voltage VINT. When the second reference voltage VREF2 is set as a higher level than the first reference voltage VREF1, the internal voltage VINT is driven to a high level in the test mode.

Hereafter, the configuration and operations of the clock control unit 2 will be described in detail with reference to FIGS. 3 to 5.

Figure 3:
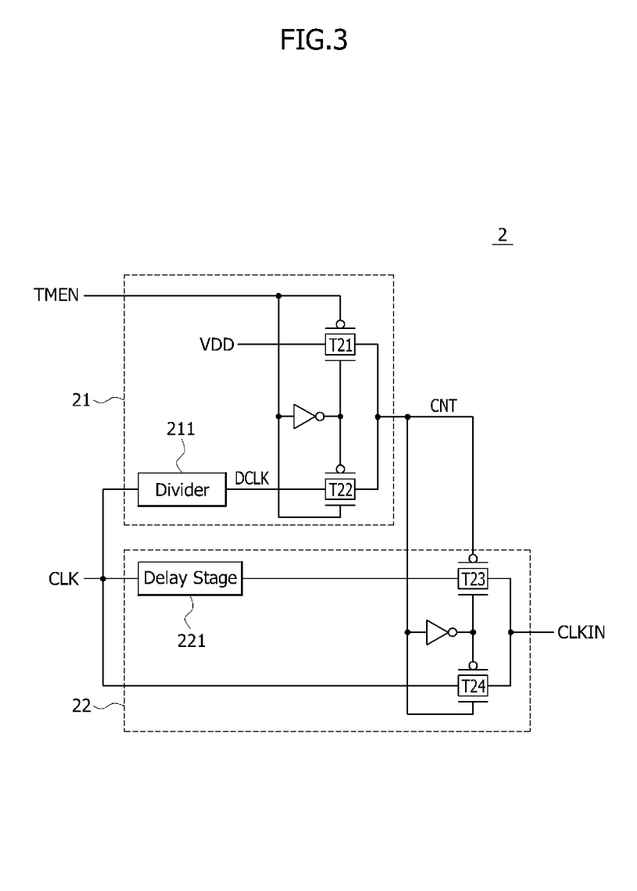
FIG. 3 is a circuit diagram showing an example embodiment of the clock control unit included in the integrated circuit shown in FIG. 1.
Figure 4:
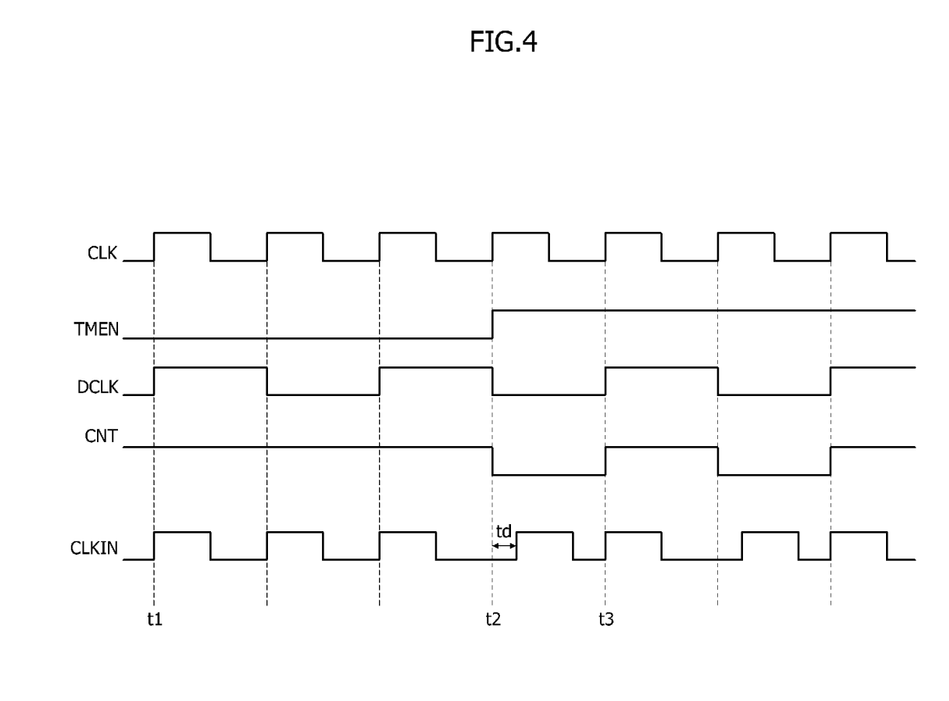
FIG. 4 is a timing diagram explaining operations of the clock control unit shown in FIG. 3.

FIG. 3 is a circuit diagram showing an example embodiment of the clock control unit 2.

Referring to FIG. 3, the clock control unit 2 includes a control signal generating section 21 configured to selectively output a power supply voltage VDD or a divided clock DCLK as a control signal CNT in response to the test mode enable signal TMEN. The clock control unit 2 may also comprise a clock transferring section 22 configured to selectively output the external clock CLK or the clock acquired by delaying the external clock CLK by a predetermined delay period as the input clock CLKIN in response to the control signal CNT.

The control signal generating section 21 includes a transfer gate T21 which is turned on by the test mode enable signal TMEN of a logic low level and transfers the power supply voltage VDD as the control signal CNT when the test mode is not entered. The control signal generating section 21 may also include a divider 211 which divides the external clock CLK and generates the divided clock DCLK. The control signal generating section 21 may further include a transfer gate T22 which is turned on by the test mode enable signal TMEN of the logic high level and transfers the divided clock DCLK as the control signal CNT when the test mode is entered.

The clock transferring section 22 includes a delay stage 221 which delays the external clock CLK by the predetermined delay period. The clock transferring section 22 may also include a transfer gate T23 which is turned on by the control signal CNT generated as the divided clock DCLK is transferred and transfers the clock outputted from the delay stage 221 as the input clock CLKIN when the test mode is entered. The clock transferring section 22 may further include a transfer gate T24 which is turned on by the control signal CNT with the level of the power supply voltage VDD and transfers the external clock CLK as the input clock CLKIN when the test mode is not entered.

Operations of the clock control unit 2 configured in this way will be described below in detail with reference to FIG. 4 on the assumption that the divided clock DCLK is generated as a divided-by-two signal of the external clock CLK and the delay stage 221 delays the external clock CLK by a period td.

First, during a period t1 to t2 in which the test mode is not entered, the control signal CNT is generated as the power supply voltage VDD is transferred by the test mode enable signal TMEN of the logic low level. Accordingly, during the period t1 to t2, the input clock CLKIN is generated as the same signal as the external clock CLK.

Next, when the test mode is entered at the time t2, since the test mode enable signal TMEN is enabled to the logic high level, the control signal CNT is generated as the divided clock DCLK is transferred. During a period t2 to t3 in which the divided clock DCLK has a logic low level, the clock delayed by the period td in the delay stage 221 is outputted as the input clock CLKIN. During a period in which the divided clock DCLK has a logic high level, the external clock CLK is outputted as the input clock CLKIN. Therefore, the cycle and the duty ratio of the input clock CLKIN generated when the test mode is entered are set to be different from the external clock CLK.

Figure 5:
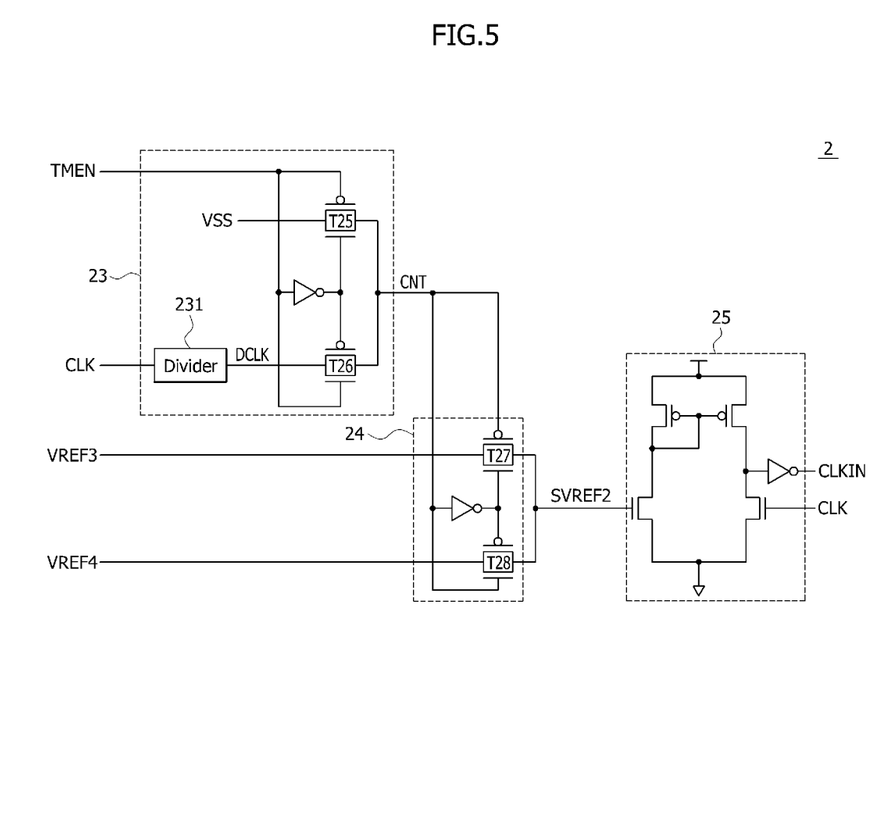
FIG. 5 is a circuit diagram showing another example embodiment of the clock control unit included in the integrated circuit shown in FIG. 1.

FIG. 5 is a circuit diagram showing another example embodiment of the clock control unit 2.

Referring to FIG. 5, the clock control unit 2 includes a control signal generating section 23 configured to selectively output the ground voltage VSS or a divided clock DCLK as a control signal CNT in response to the test mode enable signal TMEN. The clock control unit 2 also includes a second reference voltage transferring section 24 configured to selectively transfer a third reference voltage VREF3 or a fourth reference voltage VREF4 as a second selection reference voltage SVREF2 in response to the control signal CNT, and a comparing section 25 configured to compare the second selection reference voltage SVREF2 and the external clock CLK and generate the input clock CLKIN.

The control signal generating section 23 includes a transfer gate T25 which is turned on by the test mode enable signal TMEN of a logic low level and transfers the ground voltage VSS as the control signal CNT when the test mode is not entered. The control signal generating section 23 may also include a divider 231 which divides the external clock CLK and generates a divided clock DCLK. Still further, the control signal generating section 23 may include a transfer gate T26 which is turned on by the test mode enable signal TMEN of the logic high level and transfers the divided clock DCLK as the control signal CNT when test mode is entered.

The second reference voltage transferring section 24 includes a transfer gate T27 which is turned on by the control signal CNT of a logic low level and transfers the third reference voltage VREF3 as the second selection reference voltage SVREF2. The second reference voltage transferring section 24 may also include a transfer gate T28 which is turned on by the control signal CNT of a logic high level and transfers the fourth reference voltage VREF4 as the second selection reference voltage SVREF2.

Operations of the clock control unit 2 configured in this way will be described below by being divided into the case in which the test mode is not entered and the case in which the test mode is entered.

When the test mode is not entered, the control signal CNT is generated as the ground voltage VSS is transferred by the test mode enable signal TMEN of the logic low level. Accordingly, because the third reference voltage VREF3 is transferred as the second selection reference voltage SVREF2, the input clock CLKIN outputted from the comparing section 25 has specified cycle and duty ratio.

When the test mode is entered, the test mode enable signal TMEN is enabled to the logic high level, and the control signal CNT is generated as the divided clock DCLK. The second selection reference voltage SVREF2 is generated as the third reference voltage VREF3 when the control signal CNT has the logic low level, and the second selection reference voltage SVREF2 is generated as the fourth reference voltage VREF4 when the control signal CNT has the logic high level. Therefore, the cycle and the duty ratio of the input clock CLKIN outputted from the comparing section 25 are set to be different from the external clock CLK, due to the second selection reference voltage SVREF2 which periodically changes to the level of the third reference voltage VREF3 or the fourth reference voltage VREF4.

In the integrated circuit in accordance with the present embodiment, it is possible to provide a test mode in which the level of the internal voltage VINT supplied to the internal circuit 3 may be controlled and the cycle and the duty ratio of the input clock CLKIN inputted to the internal circuit 3 may be set to be different from the external clock 3. As a consequence, through the test mode provided to the integrated circuit in accordance with the present embodiment, a system failure which is caused by noise of a system voltage and jitter of a system clock may be checked before the integrated circuit is mounted to the system.

Figure 6:
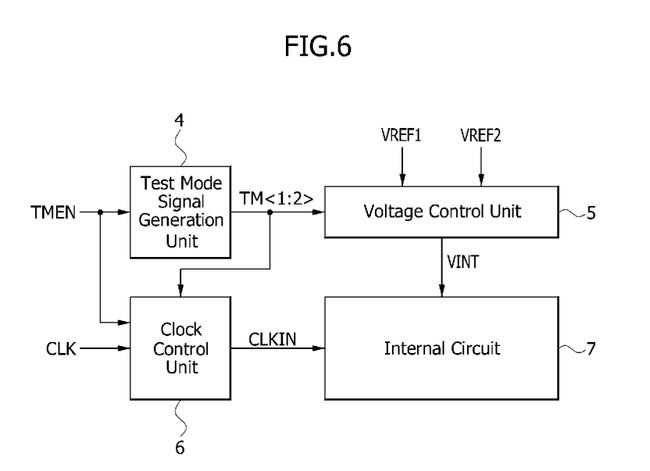
FIG. 6 is a block diagram showing a configuration of an integrated circuit in accordance with another embodiment of the present invention.

FIG. 6 is a block diagram showing a configuration of an integrated circuit in accordance with another embodiment of the present invention.

Referring to FIG. 6, an integrated circuit in accordance with the present embodiment includes a test mode signal generation unit 4, a voltage control unit 5, a clock control unit 6, and an internal circuit 7. The test mode signal generation unit 4 is configured to generate first and second test mode signals TM<1:2> in response to a test mode enable signal TMEN. The voltage control unit 5 is configured to receive a first reference voltage VREF1 and a second reference voltage VREF2 in response to the first and second test mode signals TM<1:2> and control a level of an internal voltage VINT. The clock control unit 6 is configured to control a cycle and duty ratio of an external clock CLK and generate an input clock CLKIN. The internal circuit 7 is configured to be supplied with the internal voltage VINT and operate in response to the input clock CLKIN.

The test mode signal generation unit 4 generates the first and second test mode signals TM<1:2> which are sequentially enabled to logic high levels when the test mode enable signal TMEN of a logic high level is inputted as a test mode is entered. The enable timing of the first and second test mode signals TM<1:2> generated by the test mode signal generation unit 4 may be set in a variety of ways depending upon embodiments. Only one of the first and second test mode signals TM<1:2> may be set to be enabled in the test mode.

Figure 7:
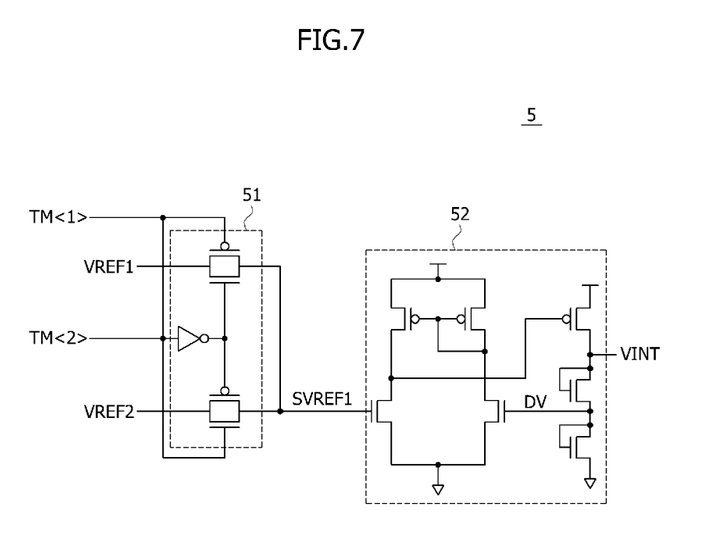
FIG. 7 is a circuit diagram showing an example embodiment of the voltage control unit included in the integrated circuit shown in FIG. 6.

Referring to FIG. 7, the voltage control unit 5 includes a first reference voltage transferring section 51 and an internal voltage driving section 52. The first reference voltage transferring section 51 is configured to transfer the first reference voltage VREF1 as a first selection reference voltage SVREF1 when the first test mode signal TM<1> is enabled to the logic high level, and transfer the second reference voltage VREF2 as the first selection reference voltage SVREF1 when the second test mode signal TM<2> is enabled to the logic high level. The internal voltage driving section 52 is configured to compare a divided voltage DV generated by dividing the internal voltage VINT with the first selection reference voltage SVREF1 and drive the internal voltage VINT.

The voltage control unit 5 configured in this way transfers the first reference voltage VREF1 as the first selection reference voltage SVREF1 when the first test mode signal TM<1> is enabled to the logic high level in the test mode, and drives the internal voltage VINT. Also, the voltage control unit 5 transfers the second reference voltage VREF2 as the first selection reference voltage SVREF1 when the second test mode signal TM<2> is enabled to the logic high level, and drives the internal voltage VINT. Accordingly, the voltage control unit 5 receives the first and second test mode signals TM<1:2> which are sequentially enabled in the test mode and drives the internal voltage VINT by changing its level.

Hereafter, a configuration and operations of the clock control unit 6 will be described in detail with reference to FIGS. 8 and 9.

Figure 8:
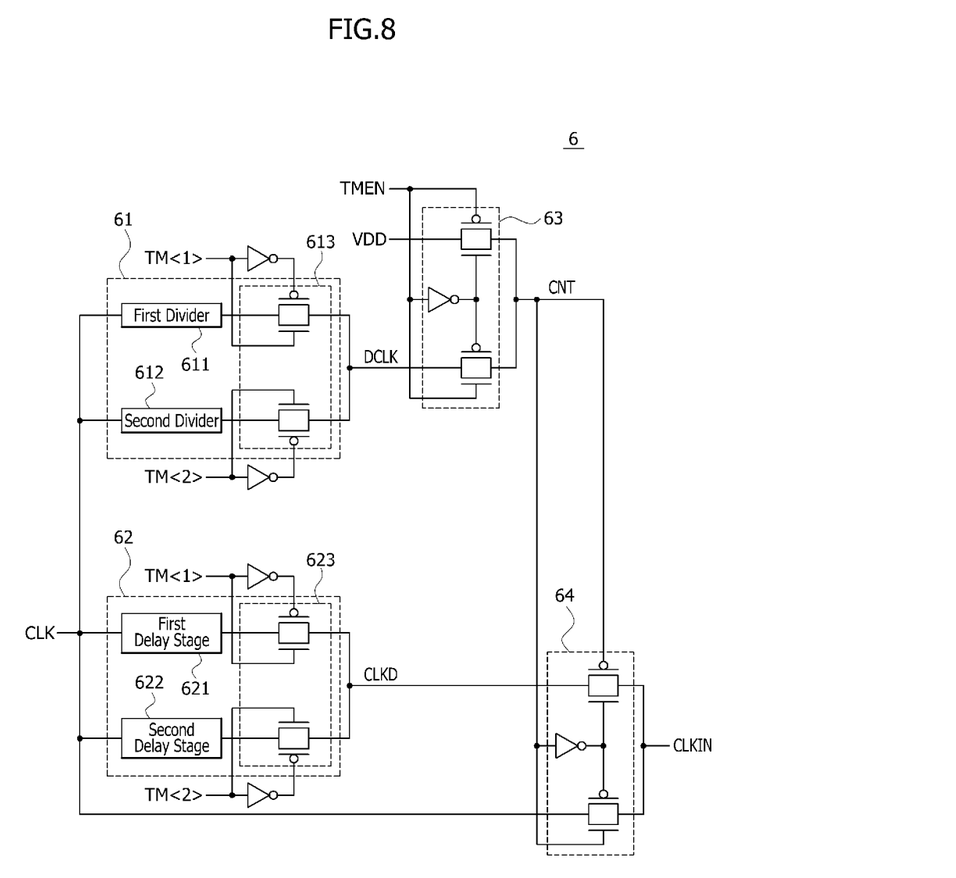
FIG. 8 is a circuit diagram showing an example embodiment of the clock control unit included in the integrated circuit shown in FIG. 6.

FIG. 8 is a circuit diagram showing an example embodiment of the clock control unit 6.

Referring to FIG. 8, the clock control unit 6 includes a divided clock generating section 61, a clock delaying section 62, a control signal generating section 63, and a clock transferring section 64. The divided clock generating section 61 is configured to divide the external clock CLK in response to the first and second test mode signals TM<1:2> and generate a divided clock DCLK. The clock delaying section 62 is configured to delay the external clock CLK in response to the first and second test mode signals TM<1:2> and generate a delayed clock CLKD. The control signal generating section 63 is configured to selectively output a power supply voltage VDD or the divided clock DCLK as the control signal CNT in response to the test mode enable signal TMEN. The clock transferring section 64 is configured to selectively output the external clock CLK or the delayed clock CLKD as the input clock CLKIN in response to the control signal CNT.

The divided clock generating section 61 includes a first divider 611 which divides the external clock CLK with a first division ratio and outputs a resultant signal, a second divider 612 which divides the external clock with a second division ratio and outputs a resultant signal. The divided clock generating section 61 also includes a first selective transfer stage 613 which outputs the output signal of the first divider 611 as the divided clock DCLK when the first test mode signal TM<1> has the logic high level and outputs the output signal of the second divider 612 as the divided clock DCLK when the second test mode signal TM<2> has the logic high level. The first and second division ratios may be set in a variety of ways depending upon an embodiment. For example, the first divider 611 may be realized to output a divided-by-two signal with a cycle two times longer than the external clock CLK, and the second divider 612 may be realized to output a divided-by-four signal with a cycle four times longer than the external clock CLK.

The clock delaying section 62 includes a first delay stage 621 which delays the external clock CLK by a first delay period and outputs a resultant signal, a second delay stage 622 which delays the external clock CLK by a second delay period and outputs a resultant signal, and a second selective transfer stage 623 which outputs the output signal of the first delay stage 621 as the delayed clock CLKD when the first test mode signal TM<1> has the logic high level and outputs the output signal of the second delay stage 622 as the delayed clock CLKD when the second test mode signal TM<2> has the logic high level. The first and second delay periods may be set in a variety of ways depending upon an embodiment.

When in the test mode, the control signal generating section 63 receives the test mode enable signal TMEN enabled to the logic high level and outputs the divided clock CLKD as the control signal CNT. When not in the test mode, the control signal generating section 63 receives the test mode enable signal TMEN disabled to a logic low level and outputs the power supply voltage VDD as the control signal CNT.

In the test mode, the clock transferring section 64 outputs the delayed clock CLKD as the input clock CLKIN when the control signal CNT generated as the divided clock DCLK is transferred has a logic low level, and outputs the external clock CLK as the input clock CLKIN when the control signal CNT has a logic high level. Moreover, when not in the test mode, the clock transferring section 64 outputs the external clock CLK as the input clock CLKIN by the control signal CNT of the logic high level.

Operations of the clock control unit 6 configured in this way will be described below by being divided into a case in which the test mode is not entered (i.e., not in the test mode) and a case in which the test mode is entered (i.e., in the test mode).

When the first test mode signal TM<1> has the logic high level and when in the test mode, the clock control unit 6 configured as described above outputs the output signal of the first delay stage 621 as the input clock CLKIN during a period in which the control signal CNT generated from the first divider 611 has the logic low level. When the second test mode signal TM<2> has the logic high level and when in the test mode, the clock control unit 6 outputs the output signal of the second delay stage 622 as the input clock CLKIN during a period in which the control signal CNT generated from the second divider 612 has the logic low level. Accordingly, the clock control unit 6 may control the duty ratio of the input clock CLKIN in the test mode, and the duty ratio may be controlled in a variety of ways according to the first and second test mode signals TM<1:2>.

Meanwhile, when the test mode is not entered, the control signal CNT is generated as the power supply voltage VDD because the test mode enable signal TMEN is the logic low level. Accordingly, the clock control unit 6 outputs the input clock CLKIN with the same cycle and the duty ratio as the external clock CLK.

Figure 9:
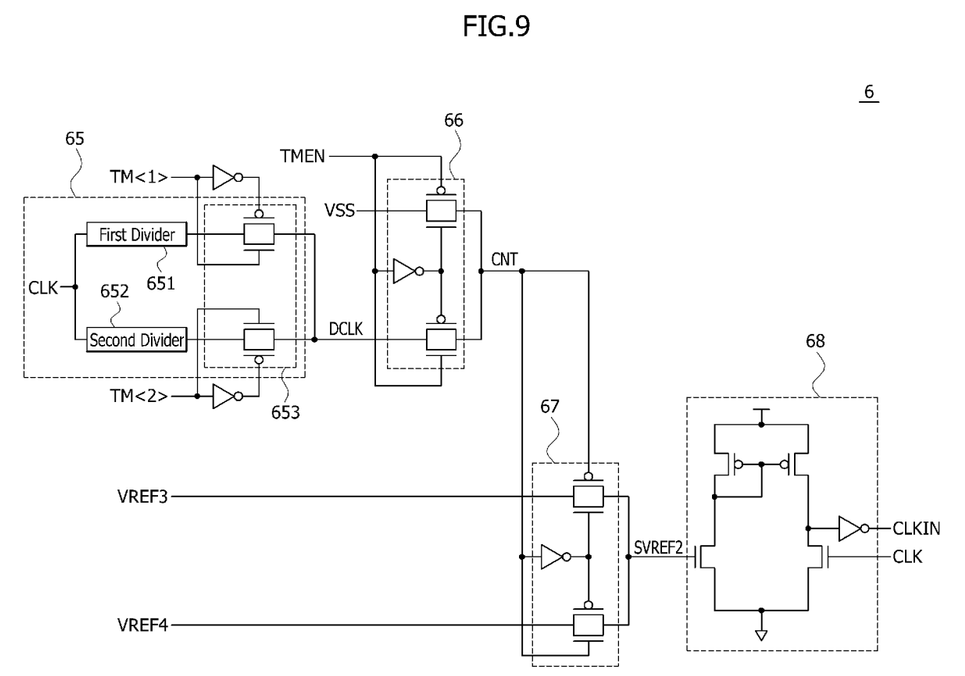
FIG. 9 is a circuit diagram showing another example embodiment of the clock control unit included in the integrated circuit shown in FIG. 6.

FIG. 9 is a circuit diagram showing another example embodiment of the clock control unit 6.

Referring to FIG. 9, the clock control unit 6 includes a divided clock generating section 65, a control signal generating section 66, a reference voltage transferring section 67, and a comparing section 68. The divided clock generating section 65 includes a first divider 651 which divides the external clock CLK with a first division ratio and outputs a resultant signal. The divided clock generating section 65 also includes a second divider 652 which divides the external clock CLK with a second division ratio and outputs a resultant signal. The divided clock generating section 65 further includes a selective transfer stage 653 which outputs the output signal of the first divider 651 as the divided clock DCLK when the first test mode signal TM<1> has the logic high level and outputs the output signal of the second divider 652 as the divided clock DCLK when the second test mode signal TM<2> has the logic high level. The control signal generating section 66 is configured to selectively output the ground voltage VSS or the divided clock DCLK as the control signal CNT in response to the test mode enable signal TMEN. The reference voltage transferring section 67 is configured to selectively transfer a third reference voltage VREF3 or a fourth reference voltage VREF4 as a second selection reference voltage SVREF2 in response to the control signal CNT. The comparing section 68 is configured to compare the second selection reference voltage SVREF2 and the external clock CLK and generate the input clock CLKIN.

Operations of the clock control unit 6 configured in this way will be described below by being divided into the case in which the test mode is not entered and the case in which the test mode is entered.

When the test mode is not entered, the control signal CNT is generated as the ground voltage VSS is transferred by the test mode enable signal TMEN of the logic low level. Accordingly, since the second selection reference voltage SVREF2 is generated as the third reference voltage VREF3 is transferred, the input clock CLKIN outputted from the comparing section 68 has a constant cycle and duty ratio.

When the test mode is entered, the test mode enable signal TMEN is enabled to the logic high level, and the control signal CNT is generated as the divided clock DCLK is transferred. Here, the divided clock DCLK is the output signal of the first divider 651 when the first test mode signal TM<1> has the logic high level and the output signal of the second divider 652 when the second test mode signal TM<2> has the logic high level. The second selection reference voltage SVREF2 is generated as the third reference voltage VREF3 is transferred when the control signal CNT has a logic low level and is generated as the fourth reference voltage VREF4 is transferred when the control signal CNT has a logic high level. Accordingly, the input clock CLKIN outputted from the comparing section 68 is set to have a different cycle and duty ratio from the external clock CLK, due to the second selection reference voltage SVREF2 which periodically changes to the level of the third reference voltage VREF3 or the fourth reference voltage VREF4.

The integrated circuit in accordance with the present embodiment provides a test mode in which the level of the internal voltage VINT supplied to the internal circuit 7 may be controlled and the cycle and duty ratio of the input clock CLKIN inputted to the internal circuit 7 may be set to be different from the external clock CLK. As a consequence, through the test mode provided to the integrated circuit in accordance with the present embodiment, a system failure which is caused by noise of a system voltage and jitter of a system clock may be checked before the integrated circuit is mounted to the system.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. An integrated circuit comprising:
a clock control unit configured to transfer a first reference voltage or a second
reference voltage as a first selection reference voltage in response to a divided clock which is generated by dividing an external clock when a test mode is entered, and generate an input clock by comparing the first selection reference voltage and the external clock;
wherein the clock control unit comprises:
a control signal generating section configured to output a divided clock which is generated by dividing an external clock as a control signal when a test mode is entered;
a first reference voltage transferring section configured to transfer a first reference voltage or a second reference voltage as a first selection reference voltage in response to the control signal; and
a comparing section configured to compare the first selection reference voltage and the external clock and generate an input clock; and
an internal circuit configured to operate in response to the input clock,
wherein the control signal generating section outputs the ground voltage as the control signal when the test mode is not entered.

2. The integrated circuit according to claim 1, wherein the first reference voltage transferring section transfers the second reference voltage with a higher level than the first reference voltage as the first selection reference voltage when the test mode is entered.

3. The integrated circuit according to claim 1, further comprising:
a voltage control unit configured to generate an internal voltage and supply the internal voltage to the internal circuit,
wherein the internal voltage is increased when the test mode is entered.

4. The integrated circuit according to claim 3, wherein the voltage control unit comprises:
a second reference voltage transferring section configured to transfer a third reference voltage or a fourth reference voltage as a second selection reference voltage in response to a test mode enable signal; and
an internal voltage driving section configured to compare the second selection reference voltage with a divided voltage generated by dividing the internal voltage, and drive the internal voltage.

* * * * *